United States Patent
Okuno et al.

(10) Patent No.: US 10,370,759 B2
(45) Date of Patent: Aug. 6, 2019

(54) SUBSTRATE THAT IS ELECTRICALLY CONDUCTIVE ON AT LEAST ONE OF THE FACES OF SAME PROVIDED WITH A STACK OF THIN LAYERS FOR GROWING CARBON NANOTUBES (CNTS)

(71) Applicant: COMMISSARIAT A L'ENERGIE ATOMIQUE ET AUX ENERGIES ALTERNATIVES, Paris (FR)

(72) Inventors: Hanako Okuno, Grenoble (FR); Raphael Ramos, Grenoble (FR); Jean Dijon, Champagnier (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 763 days.

(21) Appl. No.: 14/894,489

(22) PCT Filed: May 27, 2014

(86) PCT No.: PCT/IB2014/061749
§ 371 (c)(1),
(2) Date: Nov. 27, 2015

(87) PCT Pub. No.: WO2014/191915
PCT Pub. Date: Dec. 4, 2014

(65) Prior Publication Data
US 2016/0115031 A1   Apr. 28, 2016

(30) Foreign Application Priority Data
May 28, 2013 (FR) ..................... 13 54795

(51) Int. Cl.
*H01M 4/62* (2006.01)
*B01J 27/24* (2006.01)
(Continued)

(52) U.S. Cl.
CPC .............. *C23C 16/26* (2013.01); *B01J 23/745* (2013.01); *B01J 27/24* (2013.01); *B32B 15/012* (2013.01);
(Continued)

(58) Field of Classification Search
CPC ... C01B 31/0226; C01B 32/16; C01B 32/162; C23C 16/26; C23C 28/023;
(Continued)

(56) References Cited

U.S. PATENT DOCUMENTS

2006/0141153 A1* 6/2006 Kubota ................. B01J 23/28
                                                   427/249.1
2010/0323207 A1* 12/2010 Pinault .................. B82Y 30/00
                                                   428/446
2012/0301663 A1   11/2012 Koike et al.

FOREIGN PATENT DOCUMENTS

WO        2004000728 A1    12/2003

OTHER PUBLICATIONS

Sookhyun Hwant Et al: "Effect of a Titanium Underlayer on the Ohmic Contact of Single-Walled Carbon Nanotubes", Chinese Journal of Physics, vol. 49, No. 5, pp. 1102-1110, Oct. 1, 2011.
(Continued)

*Primary Examiner* — Daniel McCracken
(74) *Attorney, Agent, or Firm* — Cooper Legal Group, LLC; Ronald M. Kachmarik

(57) ABSTRACT

The invention concerns a substrate that is electrical conductive on at least one of the faces of same, provided with a stack of thin layers comprising at least one layer of catalyst material suitable for accelerating the growth of carbon nanotubes, characterized in that the stack comprises the sequence of thin layers deposited in the following order on top of said at least one electrically conductive face of the substrate: a) optionally, a metal made from metal M or a
(Continued)

layer of a metal alloy made from metal M or a graphene layer; b) a titanium layer (Ti); c) an aluminum layer (Al); d) a layer of catalyst material(s) for the growth of carbon nanotubes. The invention also concerns a functional substrate (6) comprising a substrate coated with a carbon nanotube (NTC) mat, a production method and the uses of such a functional substrate.

22 Claims, 4 Drawing Sheets

(51) Int. Cl.
*B32B 15/00* (2006.01)
*B82Y 30/00* (2011.01)
*B82Y 40/00* (2011.01)
*C01B 32/16* (2017.01)
*C23C 16/02* (2006.01)
*C23C 16/26* (2006.01)
*C23C 28/02* (2006.01)
*H01G 11/36* (2013.01)
*H01L 51/44* (2006.01)
*B01J 23/745* (2006.01)
*C01B 32/162* (2017.01)
*B32B 15/01* (2006.01)

(52) U.S. Cl.
CPC .......... *B32B 15/013* (2013.01); *B32B 15/017* (2013.01); *C01B 32/16* (2017.08); *C01B 32/162* (2017.08); *C23C 16/0272* (2013.01); *C23C 28/023* (2013.01); *H01G 11/36* (2013.01); *B82Y 30/00* (2013.01); *B82Y 40/00* (2013.01); *H01L 51/444* (2013.01); *H01M 4/625* (2013.01)

(58) Field of Classification Search
CPC .... C23C 16/0272; H01G 11/36; B01J 23/745; B01J 27/24; B32B 15/013; B32B 15/017; B32B 15/012; H01M 4/625; H01L 51/444; B82Y 30/00; B82Y 40/00
See application file for complete search history.

(56) References Cited

OTHER PUBLICATIONS

Ng, H T et al: "Growth of carbon nanotubes: a combinatiorial metod to study the effects of catalysts and underlayers", Journal of Physical Chemistry. B, Materials, Surfaces, Interfaces and Biophysical, Washing, DC, vol. 107, jNo. 33, pp. 8484-8489, Aug. 21, 2003 *p. 8485, clonne de gauche.
Lee, Kuei-Yi et al: "Vertically aligned growth of carbon nanotubes with long length and high density", Journal of Vacuum Science and Technology: Part B, AVS/AIP, Melville, New York, NY, vol. 23, No. 4, pp. 1450-1453, abstract, Jul. 20, 2005.
Nessim, Gilbert D. et al: "The Critical Role of the Underlayer Material and Thickness in Growing Vertically Aligned Carbon Nanotubes and Nanofibers on Metallic Substrates by Chemical Vapor Dep[osition", Advanced Functional Materials, Wiley-V C H Verlag GMBH & Co. KGAA, DE, vol. 20, No. 8, pp. 1306-1312, abstract, Apr. 23, 2010.
International Search Report for PCT/IB2014/061749, dated Jan. 8, 2014.

* cited by examiner

SUBSTRATE THAT IS ELECTRICALLY CONDUCTIVE ON AT LEAST ONE OF THE FACES OF SAME PROVIDED WITH A STACK OF THIN LAYERS FOR GROWING CARBON NANOTUBES (CNTS)

TECHNICAL FIELD

The present invention relates to carbon nanotubes (CNTs).

It relates more particularly to the improvement in the catalytic growth of CNTs on a substrate which has an electrical conductor on at least one of its faces, for the purpose of increasing the density of the CNTs in the mat form and the electrical and advantageously thermal conduction between these CNTs and said face of the substrate.

The applications targeted by the invention are numerous and are those using electrical and/or thermal properties of the CNTs, among which may be mentioned interconnections in microelectronics, CNT-based electrodes for batteries, such as lithium-sulfur batteries, or supercapacitors, interposers used for thermal management in microelectronics, or heat exchangers.

Some definitions are given below.

"Mat of nanotubes" is understood, here and in the context of the invention, to mean a layer of nanotubes which are substantially parallel to one another and which are oriented perpendicularly to the substrate, the thickness of which is close to the unit length of the nanotubes.

"Base" and "tip" growth modes are understood, here and in the context of the invention, to mean the CNT growth modes widely accepted in the field, such as described specifically in the publication [1] in chapter 8, *"Carbon Nanotube Synthesis and Growth Mechanism"*, subchapter 3, *"CNT Growth Mechanism"*.

PRIOR ART

CNTs have a high potential for the abovementioned applications, provided that it is possible to grow them in the form of dense mats, i.e. with CNTs which are small in diameter, on substrates which are electrically conducting on at least one of their faces, such as metal substrates or substrates covered with one or more layers of graphene, and that it is possible to obtain good electrical conduction, advantageously thermal conduction, between the CNTs and the conducting face of the substrate.

Several studies relating to the growth of CNTs on substrates have already been carried out.

Thus, for nanoelectronic applications, it is widely known to grow CNTs using metal catalysts deposited directly on semiconducting or insulating substrates, such as substrates made of silicon (Si) or silicon dioxide ($SiO_2$). Among the three deposition techniques known for the growth of CNTs, which are electric arc ablation, laser ablation or chemical vapor deposition (CVD), the latter is that which is the most promising on the industrial scale for reasons of cost.

The publication [2] describes the growth of CNTs by CVD on an insulating substrate made of $SiO_2$. A stack of three layers, namely respectively a layer of titanium (Ti) with a thickness of 10 nm surmounted with a layer of aluminum with a thickness of 10 nm, itself surmounted by a layer made of iron (Fe) with a thickness of 1 nm, is deposited on the substrate. It is indicated in this publication [2] that the addition of Ti makes it possible to reduce the contact electrical resistance between the CNTs and the electrodes. Only isolated Single-Walled carbon NanoTubes (SWNTs) were formed. The growth of the CNTs carried out experimentally according to this publication [2] is thus relatively poor with a low CNT density.

Just one method appears to exist to date for producing dense mats of CNTs electrically connected to the graphene constituting the substrates. This method is disclosed in the publication [3] and is based on an "inverted" growth mode. A stack of two layers, namely respectively a layer of CNT growth catalyst deposited directly on the graphene and surmounted by a layer of alumina ($Al_2O_3$), is described. Typically, the stack is composed of a layer of Fe with a thickness of 1 nm surmounted by a layer of $Al_2O_3$ with a thickness of 3 nm. The main disadvantage of this method is related to the growth mode used, which does not produce dense CNT mats.

As regards CNT growth on metal substrates, numerous studies have been published: reference may be made to the publication [1], chapter 6, *"Direct Growth of Carbon Nanotubes on Metal Supports by Chemical Vapor Deposition"*, which is a summary of these studies.

It emerges above all from the studies that it is difficult to force CNT mats onto metals, since the high temperatures necessary for deposition by CVD cause the growth catalyst to diffuse into the metal of the substrate, which then becomes ineffective. For this reason, it proves to be necessary to use a barrier in order to prevent this diffusion but these barriers are most of the time insulating, both electrically and thermally. In other words, these insulating barriers affect the electrical conductivity between metal substrates and CNTs.

Essentially two types of conductive barrier layers for CNT mat growth are known, namely a layer made of titanium nitride (TiN) and a layer made of aluminum (Al).

It could be observed that, with a barrier layer made of TiN, the growth of the CNTs generally takes place in the "tip growth" mode and that not very dense mats having relatively large CNTs are obtained.

Conversely, with a barrier layer made of Al, it has been found that a "base growth" growth mode favorable to the growth of dense mats having small CNTs is obtained. The major disadvantage is that the electrical conductivity is relatively poor between the metal substrate and the CNTs, since the aluminum is in oxidized form after growth of the CNTs.

The publication [4] describes such a barrier layer made of Al surmounted by a layer made of Fe as growth catalyst. From this publication [4], it emerges that it is necessary to have a sufficiently thick layer made of Al, typically with a thickness of greater than 3.5 nm, in order to obtain adequate growth: it is shown, on the contrary, that, with a layer of Al with a thickness of only 2 nm, the quality of the CNT mat is degraded (see FIG. 2f).

Consequently, barrier layers made of Al with a thickness of 10 to 20 nm have generally been envisaged. After growth of the CNTs, a 10 to 20 nm layer of oxidized aluminum is thus present between the metal substrate and the CNT mat, which implies a low electrical conductivity.

There thus exists a need to improve the growth of CNTs in the mat form on substrates which are electrically conducting on at least one of their faces, such as metal substrates or substrates coated with graphene, in particular for the purposes of increasing the density of the CNT mats and the increasing of electrical conductivity, advantageously thermal conductivity, between these CNTs and said conducting faces of the substrates.

The aim of the invention is to respond, at least in part, to this need.

ACCOUNT OF THE INVENTION

In order to do this, the invention relates, according to one of its aspects, to a substrate which is electrically conducting on at least one of its faces, provided with a stack of thin layers comprising at least one layer of catalyst material appropriate for accelerating the growth of carbon nanotubes, characterized in that the stack comprises the sequence of thin layers deposited in the following order above said at least one electrically conducting face of the substrate:

a/ if appropriate, metal layer made of metal M or layer made of metal alloy based on the metal M or layer made of graphene;
b/ titanium (Ti) layer;
c/ aluminum (Al) layer;
d/ layer of material(s) which is(are) catalyst(s) of the growth of carbon nanotubes.

In other words, the invention consists in producing, on at least the electrically conducting face of a substrate, a stack comprising at least three conducting layers in order, on the one hand, to grow dense mats of small CNTs, typically with a unit diameter of less than 10 nm, and, on the other hand, to ensure good electrical and thermal conduction between the CNTs and the conducting face of the substrate.

The dense mats of small CNTs obtained are in the form of Multi-Walled carbon NanoTubes (also known as MWNTs).

The metal layer made of metal M or layer made of metal alloy based on a metal M or layer made of graphene is optional as, when the substrate is made of stainless steel, no native oxide is formed. There is thus no alloy harmful to the electrical conductivity which is formed in the temperature range envisaged for the growth of CNTs by CVD.

When it is present, the metal layer M plays different roles depending on the nature of the underlying substrate. Several cases may thus be distinguished in order to make possible the choice of the nature and the thickness of the layer made of metal M. It must in particular make it possible to prevent the diffusion of the Ti into the underlying substrate and to prevent the formation of an alloy between the Ti and the underlying substrate. A fine layer of a metal which does not diffuse much into the substrate and into the Ti or a thicker layer of a metal which may diffuse into the substrate is thus chosen. In the case where the substrate is a metal which rapidly passivates, such as aluminum, the function of the layer M is advantageously in addition to increase the conductivity of the surface native oxide. A fine layer of a metal which may diffuse into the corresponding oxide is then chosen.

The thin Al/Ti bilayer has several functions in the context of the invention. It first of all makes possible the dewetting of the catalyst and the growth of CNTs according to the "base growth" mode, thus ensuring the growth of a dense mat of CNTs having small unit diameters, typically of less than 10 nm. It also has the role of a barrier, both barrier to the diffusion of the catalyst and in particular barrier to oxidation. It thus makes it possible to control and reduce the thickness of the oxidized layer possibly being formed during the growth of the CNTs. In the end, it thus makes it possible to obtain an excellent electrical conductivity of the interface.

The inventors have been able to prove that the stack of thin layers according to the invention, consisting of at least Al/Ti/Fe, makes possible the growth of dense mats of small CNTs on substrates which are either metallic or coated with graphene, this being the case whatever the nature of the substrate-support of the graphene, while ensuring good electrical and thermal conduction between the CNTs and the substrate.

According to an advantageous embodiment, the substrate may be a bulk metal substrate. The metal of the substrate may then advantageously be chosen from copper (Cu), aluminum (Al), stainless steel, nickel (Ni) or platinum (Pt).

According to another advantageous embodiment, the substrate may be a substrate coated with one or more thin electrically conducting layers forming said electrically conducting face. The thin electrically conducting layer(s) may then advantageously be chosen from titanium nitride (TiN), tantalum nitride (TaN) or graphene.

The coated substrate can advantageously be an electrically insulating substrate, such as a substrate made of silicon (Si) or made of silicon dioxide ($SiO_2$).

Preferably, the metal M of the metal layer deposited directly on the electrically conducting face of the substrate is chosen from iron (Fe), chromium (Cr), nickel (Ni), cobalt (Co) or palladium (Pd), and also from all the binary, ternary or quaternary alloys between these metals.

Also preferably, the material(s) which is(are) catalyst(s) of the growth of the carbon nanotubes (CNTs) of the layer of the top of the stack is(are) chosen from iron (Fe), chromium (Cr), nickel (Ni), cobalt (Co) or palladium (Pd), and also from all the binary, ternary or quaternary alloys between these metals.

According to an advantageous alternative form, the layer deposited directly on the electrically conducting face of the substrate and the layer of material which is a catalyst of the growth of carbon nanotubes are composed of the same material. This has the advantage of simplifying the process for the deposition of the thin layers, in particular by vacuum evaporation in the same vacuum cycle.

The thickness of the layer deposited directly on the electrically conducting face of the substrate is preferably between 1 and 20 nm.

The thickness of the Ti layer is preferably between 2 and 10 nm.

The thickness of the Al layer is preferably between 2 and 10 nm.

The thickness of the layer of material(s) which is(are) catalyst(s) of the growth of carbon nanotubes is preferably between 0.2 and 5 nm, more preferably between 0.25 and 2 nm.

The stack may be as follows: bulk substrate made of copper or of aluminum/Fe/Ti/Al/Fe, the iron (Fe) layer directly in contact with the bulk substrate having a thickness of between 1 and 10 nm.

The stack may also be as follows: bulk substrate made of stainless steel/Ti/Al/Fe.

The stack may also be as follows: substrate made of titanium nitride (TiN) or tantalum nitride (TaN) in the form of thin layers/Fe/Ti/Al/Fe, the iron (Fe) layer directly in contact with the substrate having a thickness of between 10 and 20 nm.

The stack may also be as follows: bulk substrate covered with one or more layers made of graphene/Fe/Ti/Al/Fe, the iron (Fe) layer directly in contact with the graphene having a thickness of between 1 and 10 nm.

Another subject matter of the invention, according to another of its aspects, is a functional substrate comprising a substrate which has just been described, coated with a mat of carbon nanotubes (CNTs). In such a substrate, the CNTs density is advantageously greater than $10^{12}/cm^2$, indeed even $10^{13}/cm^2$.

Another subject matter of the invention, according to yet another of its aspects, is a process for the preparation of a functional substrate which has just been described, according to which the following stages are carried out:

preparation, by vacuum evaporation, of the stack of thin layers, if appropriate with the metal layer made of metal M or layer made of metal alloy based on the metal M or layer made of graphene, on the electrically conducting face of the substrate described above;

growth of mat of carbon nanotubes (CNTs) on the stack according to a chemical vapor deposition (CVD) technique, enhanced or not enhanced by plasma and activated or nonactivated by hot wires (Hot Wire CVD or HWCVD).

According to an advantageous alternative form, before carrying out the growth stage, the layer of catalyst material(s) is oxidized by means of an air plasma.

A final subject matter of the invention is the use of a functional substrate described above as element of interconnections in microelectronics, or of electrodes for batteries, such as lithium-sulfur batteries, or of supercapacitors, of interposers used for thermal management in microelectronics, or of heat exchangers.

DETAILED DESCRIPTION

Other advantages and characteristics of the invention will emerge more clearly on reading the detailed description of implementational examples of the invention given by way of illustration and without limitation with reference to the following figures, among which:

FIG. 1 is a diagrammatic view in transverse cross section of a substrate coated with a stack of thin layers according to the invention, FIG. 2 is an image taken with a scanning electron microscope (SEM) of a dense mat of CNTs on a substrate made of aluminum obtained by a CVD technique in accordance with the invention, FIG. 3A is an image taken by SEM of a dense mat of CNTs on a substrate made of aluminum obtained by a hot wire CVD (HWCVD) technique in accordance with the invention, FIG. 3B is an image taken by transmission electron microscopy (TEM) of a CNT on a substrate made of aluminum obtained by a hot wire CVD (HWCVD) technique in accordance with the invention, FIG. 4 is a diagrammatic view in transverse cross section of a substrate made of stainless steel coated with a stack of thin layers according to the invention, FIGS. 5A and 5B are images taken, respectively at 45° and in cross section, by SEM of a dense mat of CNTs on a substrate made of nickel supporting a stack of graphene layers, in accordance with the invention, FIGS. 6A to 6C are images taken at 45° by SEM of a dense mat of CNTs on a substrate made of $SiO_2$ respectively supporting one, two and three graphene layers, in accordance with the invention, FIG. 6D is an image taken by TEM of a CNT on a substrate made of $SiO_2$ supporting at least one graphene layer, in accordance with the invention.

It is specified here that, for the sake, the different proportions between the thicknesses of materials have not been observed.

It is specified that the unit of flow indicated below under the acronym sccm for "standard cubic centimeters per minute" corresponds to the unit of a flow rate of one cubic centimeter per minute under the conditions of temperature at 0° C. and of pressure at 101.325 kPa.

It is specified that examples 1 to 6 are carried out in accordance with the invention and that the examples carried out according to the state of the art and given as comparative examples are not referenced but are each explained at the end of the description of an example in accordance with the invention.

In all these examples, the successive depositions of the thin layers 3, 4, 5 and optionally 2 on the substrate 1 were carried out according to a vacuum evaporation technique in one and the same vacuum cycle. Very obviously, in the context of the invention, they may be carried out by any other technique which makes possible good control over the thicknesses of layers obtained.

Example 1

This example 1 relates to the growth of dense mats of CNTs on an aluminum (Al) substrate 1. In this example 1, the substrate may be produced in the form of thin layer(s) or be composed of a bulk material made of Al. As aluminum passivates very rapidly in air, the thin layer 2 is composed of a fine layer of a metal M which may diffuse into the aluminum oxide, advantageously iron.

The stages of the process for producing a dense mat of CNTs are as follows:

Stage 1/: The substrate 1 made of Al is deoxidized in a bath of HF diluted to 0.1% for a period of time of 30 s.

Stage 2/: The successive depositions of the thin layers 2, 3, 4 and 5 on the substrate 1 made of Al are subsequently carried out. Thus, after deposition of the stack, as shown in FIG. 1, the substrate 1 is respectively surmounted by a layer 2 made of iron, by a titanium layer 3, then by a layer 4 of aluminum and finally by a layer 5 made of iron as catalyst.

The stack is thus of the type substrate made of Al/Fe/Ti/Al/Fe.

The thickness in nanometers (nm) of each of the thin layers of the stack on the substrate 1 made of Al is shown in table 1 below.

TABLE 1

| THIN LAYER | THICKNESS |
|---|---|
| Fe (2) | 1-10 nm, preferably equal to 2 nm |
| Ti (3) | 5 nm |
| Al (4) | less than 5 nm, preferably equal to 2 nm |
| Fe (5) | 1 nm |

Stage 3/: The growth of a mat of CNTs is carried out by a chemical vapor deposition (CVD) technique at 600° C. using a $C_2H_2/H_2/He$ gas mixture introduced into the CVD reactor in the following respective flow rates: 15 sccm/50 sccm/110 sccm.

The other conditions of the CVD deposition are as follows:
pressure of the gas mixture at 0.3 Torr;
time for rise between ambient temperature and 600° C.: 15 minutes;
duration of growth from 10 minutes to 1 hour, according to the desired height of CNT mat.

It is specified here that this growth was carried out, after having oxidized the catalyst layer 5 beforehand, by means of a capacitive RF air plasma with a power of 70 W at a pressure of 0.3 Torr and for a period of time of 30 min.

According to an advantageous application of this example 1, the growth of the CNTs can be carried out in vias with a diameter of 250 nm which are intended to emerge on lines of Al in order to produce interconnections in microelectronics: FIG. 2 clearly illustrates this growth of the CNTs between the vias.

Example 1 according to the invention, which has just been described, makes it possible to obtain mats of CNTs with densities exceeding $10^{12}/cm^2$.

In addition, the electrical conduction between a mat 6 of CNTs and the Al substrate 1 obtained according to this example 1 is greatly increased with respect to the state of the art. In particular, the specific contact resistance obtained between the Al substrate 1 and a mat 6 of CNTs according to the invention is less than $3 \times 10^{-8}$ $\Omega cm^2$.

Thus, as comparative example, the electrical conduction obtained according to example 1 of the invention is increased by a factor at least equal to 3 with respect to a substrate made of Al either directly surmounted solely by a 1 nm layer of Fe or surmounted by a 10 nm layer made of Al, itself surmounted by a layer of 1 nm of Fe (stack: substrate made of Al/Al/Fe).

Example 2

Stages 1/ and 2/ of example 1 are reproduced exactly. Only stage 3/ of growth of the CNTs is modified in the following way:
  no preliminary oxidation of the catalyst layer 5 (1 nm of Fe);
  hot filament CVD (HFCVD).

It is specified that the gas mixture is identical to that of example 1 with the same flow rates, that the temperature of the HFCVD is approximately 450° C. and that the power of hot filaments applied is of the order of 450 W.

Example 2 according to the invention, which has just been described, makes it possible to obtain mats of CNTs in the MWNT form, having a mean unit diameter of 6 nm, with on average six walls per CNT. The density of CNT walls obtained is greater than $10^{13}/cm^2$.

FIG. 3A shows a mat 6 of CNTs 60 in the MWNT form obtained according to example 2 of the invention, while FIG. 3B shows in detail the structure of a CNT also obtained according to example 2.

In addition, electrical conduction between a mat 6 of CNTs and the Al substrate 1 obtained according to example 2 is greatly increased with respect to the state of the art.

Thus, as comparative example, the electrical conduction obtained according to example 2 of the invention is increased by a factor of 10 to 100 with respect to a substrate made of Al directly surmounted solely by a layer of 1 nm of Fe and which the growth of CNTs was also activated by hot filaments (HFCVD).

Example 3

This example 3 relates to the growth of dense mats of CNTs on a copper (cu) substrate 1. In this example 3, the substrate may be produced in the form of thin layer(s) or be composed of a bulk material made of Cu. As the titanium has the ability to readily diffuse into the copper, the thin layer 2 is composed of a fine layer of a metal M, advantageously iron, which makes it possible to prevent this diffusion phenomenon.

The steps of the process for producing a dense mat of CNTs are as follows:

Stage 1/: The successive depositions of the thin layers 2, 3, 4 and 5 on the substrate 1 made of Cu are subsequently carried out. Thus, after the deposition of the stack, as shown in FIG. 1, the substrate 1 is surmounted respectively by a layer 2 made of iron, by a titanium layer 3, then by a layer 4 made of aluminum and finally by a layer 5 made of iron as catalyst.

The stack is thus of the type substrate made of Cu/Fe/Ti/Al/Fe.

The thickness in nanometers (nm) of each of the thin layers of the stack on the substrate 1 made of Cu is shown in table 2 below.

TABLE 2

| THIN LAYER | THICKNESS |
| --- | --- |
| Fe (2) | 1-10 nm, preferably equal to 2 nm |
| Ti (3) | 5 nm |
| Al (4) | less than 5 nm, preferably equal to 2 nm |
| Fe (5) | 1 nm |

The stack of layers 2 to 5 and the corresponding thicknesses are thus identical to those of examples 1 and 2.

Stage 2/: The growth of a mat of CNTs is carried out according to the same technique with the same conditions as for example 1.

Example 3 according to the invention, which has just been described, makes it possible to obtain mats of CNTs with growth on Cu according to a "base growth" mode.

Thus, the mode of growth of the CNTs according to this example 3 of the invention is much better than that of "tip growth" type observed according to the state of the art on a substrate in Cu, in particular when use is made, as barrier layer, of a thin layer of titanium nitride (TiN) which results in growth in "tip growth" mode and thus in mats of CNTs having low densities.

Alternatively, the Fe layer 2 directly deposited on the copper can be replaced with a Cr, Ni, Co or Pd layer of similar thickness or a graphene layer.

This example 3 according to the invention may be applied in the same way to a substrate made of nickel (Ni) instead of a substrate made of copper.

Example 4

This example 4 relates to the growth of dense mats of CNTs on a TiN substrate 1 in the form of thin layer(s). Due to the columnar structure of TiN in a thin layer, the majority of metals diffuse strongly into TiN. Thus, the thin layer 2 is in this instance composed of a fine layer of a metal M, advantageously iron, which is relatively thick, preferably a layer of 10 to 20 nm.

The stages of the process for the preparation of a dense mat of CNTs are as follows:

Stage 1/: The successive depositions of the thin layers 2, 3, 4 and 5 on the substrate 1 made of TiN are subsequently carried out. Thus, after deposition of the stack, as shown in FIG. 1, the substrate 1 is respectively surmounted by a layer 2 made of iron, by a titanium layer 3, then by a layer 4 made of aluminum and finally by a layer 5 made of iron as catalyst.

The stack is thus of the type substrate made of TiN/Fe/Ti/Al/Fe.

The thickness in nanometers (nm) of each of the thin layers of the stack on the substrate 1 made of TiN is shown in table 3 below.

TABLE 3

| THIN LAYER | THICKNESS |
| --- | --- |
| Fe (2) | 10-20 nm, preferably equal to 20 nm |
| Ti (3) | 5 nm |
| Al (4) | less than 5 nm, preferably equal to 2 nm |
| Fe (5) | 1 nm |

Stage 2/: The growth of a mat of CNTs is carried out according to the same technique with the same conditions as for examples 1 and 3.

Example 4 according to the invention, which has just been described, makes it possible to obtain mats of CNTs with growth on TiN according to a "base growth" mode.

Alternatively, the Fe layer 2 deposited directly on TiN may be replaced with a Cr, Ni or Co layer of similar thickness.

This example 4 according to the invention may be applied in the same way to a substrate made of tantalum nitride (TaN) instead of a substrate made of TiN.

Example 5

This example 5 relates to the growth of dense mats of CNTs on a stainless steel substrate 1 in the form of a bulk material. Stainless steel is a material which does not form a native oxide and into which titanium does not diffuse to a great extent and does not form an alloy in the temperature range envisaged for the growth of CNTs by CVD. In this instance, it is possible to envisage dispensing with the thin layer 2.

The stages of the process for the preparation of a dense mat of CNTs are as follows:

Stage 1/: The successive depositions of the thin layers 3, 4 and 5 on the substrate 1 made of stainless steel are subsequently carried out. Thus, after deposition of the stack, as shown in FIG. 4, the substrate 1 is respectively surmounted with a titanium layer 3, then with a layer 4 made of aluminum and finally with a layer 5 made of iron as catalyst.

The stack is thus of the type substrate made of stainless steel/Ti/Al/Fe.

The thickness in nanometers (nm) of each of the thin layers of the stack on the substrate 1 made of stainless steel is shown in table 4 below.

TABLE 4

| THIN LAYER | THICKNESS |
|---|---|
| Ti (3) | 5 nm |
| Al (4) | less than 5 nm, preferably equal to 2 nm |
| Fe (5) | 1 nm |

Stage 2/: The growth of a mat of CNTs is carried out according to the same technique with the same conditions as for examples 1, 3 and 4.

Example 3 according to the invention, which has just been described, makes it possible to obtain mats of CNTs with growth on the stainless steel according to a "base growth" mode.

In addition, the electrical conduction at the interface between a mat 6 of CNTs and the substrate 1 made of stainless steel obtained according to this example 5 is good.

Example 6

This example 6 relates to the growth of dense mats of CNTs on a substrate 1, at least one face of which is made of graphene.

The substrate 1 supporting the face made of graphene can be metallic, such as Cu, Ni or Pt. It may also be made of electrical insulating material, such as made of silicon (Si) or made of silicon dioxide ($SiO_2$).

The substrate 1 may support one or more layers of graphene constituting an electrically conducting face. Thus, a single layer of graphene or a stack of several layers of graphene, up to the graphene produced by exfoliation of highly oriented pyrolytic graphite (HOPG), may be concerned.

The thin layer 2 is composed of a fine layer of a metal M, advantageously made of iron, which makes it possible to prevent the formation of alloy of titanium carbide type between the graphene and the titanium of layer 3.

The stages of the process for preparation of a dense mat of CNTs are as follows:

Stage 1/: The successive depositions of the thin layers 2, 3, 4 and 5 on the substrate supporting at least one graphene layer forming an electrically conducting face are subsequently carried out. Thus, after deposition of the stack, as shown in FIG. 1, the graphene 1 face is respectively surmounted by a layer 2 made of iron, by a titanium layer 3, then by a layer 4 made of aluminum, and finally, by a layer 5 made of iron as catalyst.

The stack is thus of the type substrate with face made of graphene/Fe/Ti/Al/Fe.

The stack of layers 2 to 5 and the corresponding thicknesses are identical to those of examples 1 to 3.

Stage 2/: The growth of a mat of CNTs is carried out according to the same technique of hot filament CVD deposition with the same conditions of temperature and gas mixture with the respective flow rates as for example 2.

The other conditions of the CVD deposition are as follows:
  pressure of the gas mixture is 0.3 Torr;
  time for rise between ambient temperature and 450° C.: 12 minutes;
  duration of growth from 10 to 30 minutes, depending on the desired height of CNT mat.

Example 6 according to the invention with a substrate made of nickel supporting a stack of graphene layers makes it possible to obtain mats of CNTs with densities exceeding $10^{12}/cm^2$.

In addition, the electrical conduction between a mat 6 of CNTs and the substrate made of Ni supporting a stack of graphene layers which is obtained according to this example 6 is greatly increased with respect to the state of the art and is entirely comparable with that obtained between the mat 6 of CNTs and the substrate 1 made of Al of example 1 according to the invention.

FIGS. 5A and 5B show a mat 6 of CNTs 60 in the MWNT form obtained according to example 6 of the invention with a substrate made of nickel supporting a stack of graphene layers.

Example 6 according to the invention with a substrate made of $SiO_2$ onto which one or more graphene layers is(are) transferred makes it possible to obtain mats of CNTs in the MWNT form having a mean unit diameter of 5 nm, with on average two or three walls per CNT. The density of CNT walls obtained is greater than $10^{12}/cm^2$.

Figure 1:
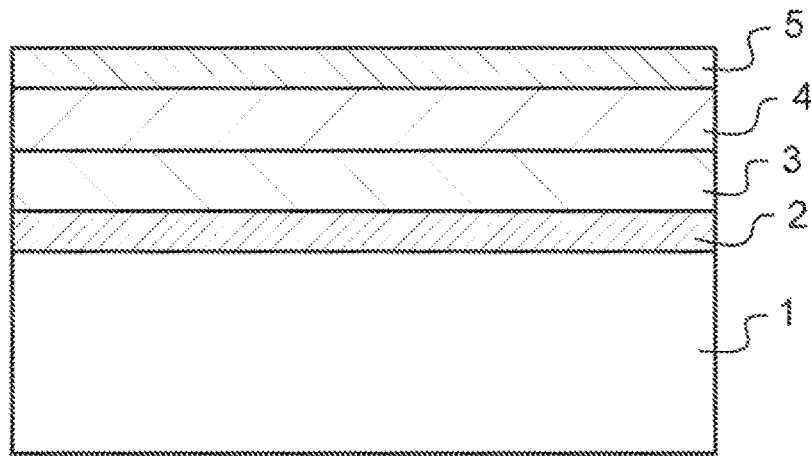
Figure 2:
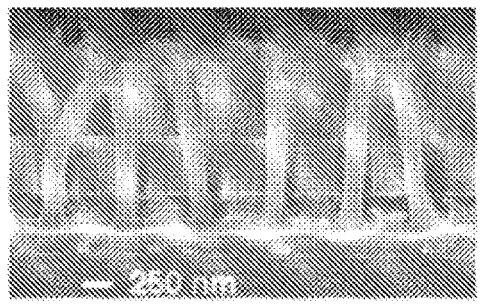
Figure 3A:
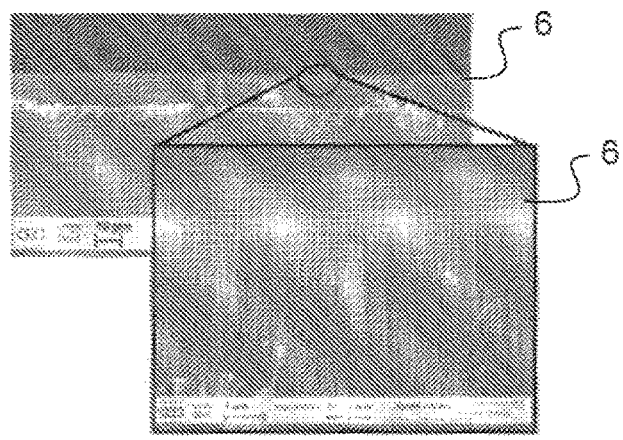
Figure 3B:
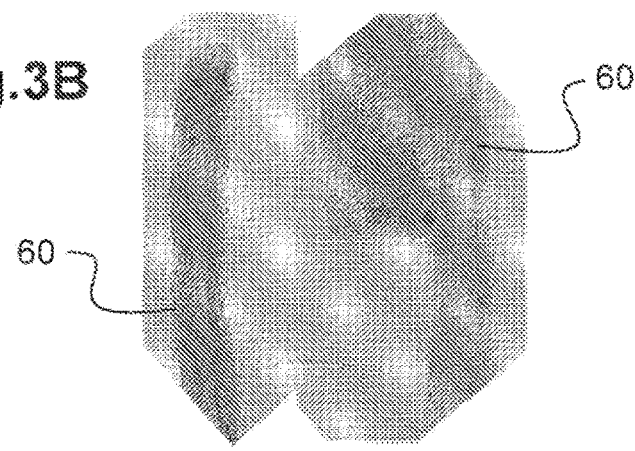
Figure 4:
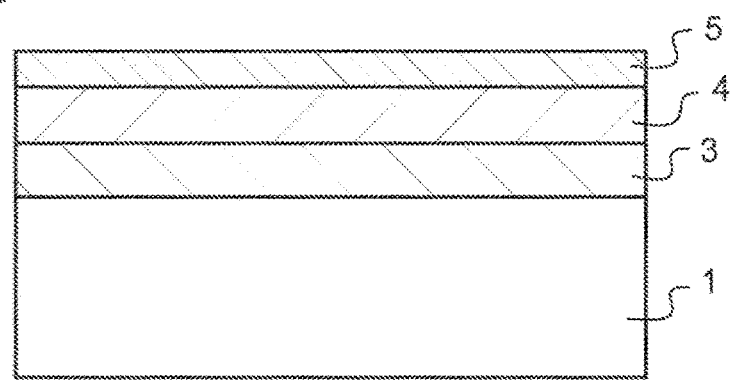
Figure 5A:
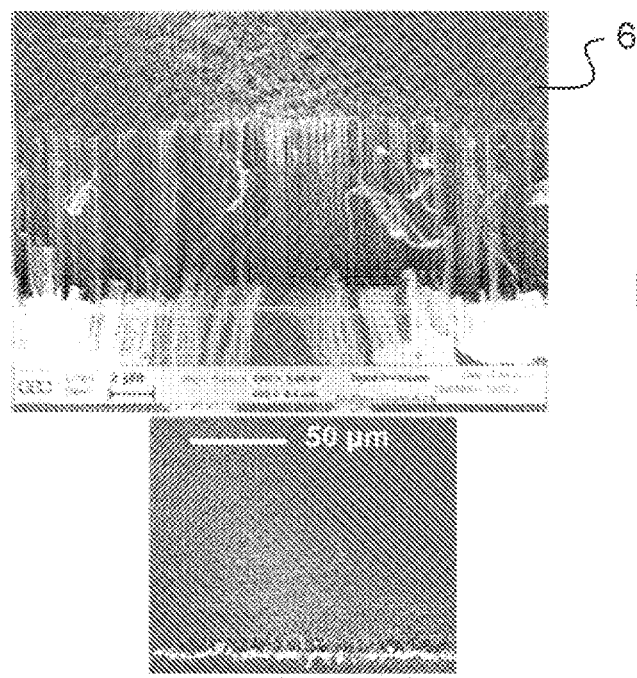
Figure 5B:
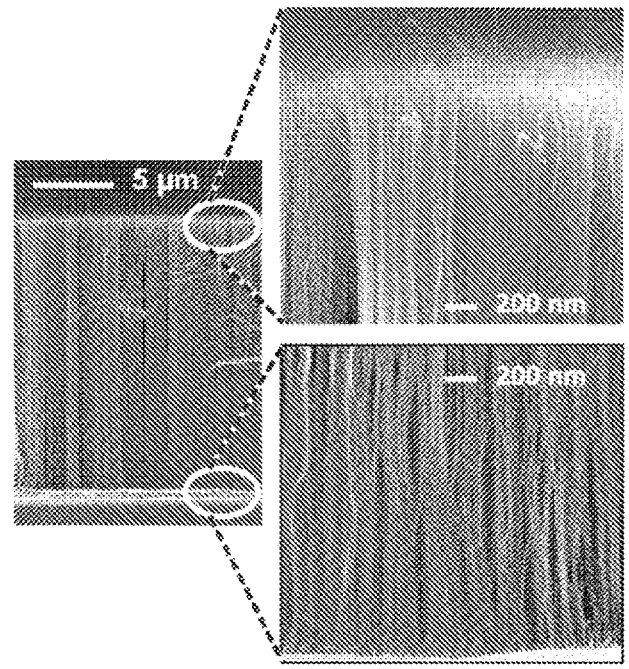
Figure 6A:
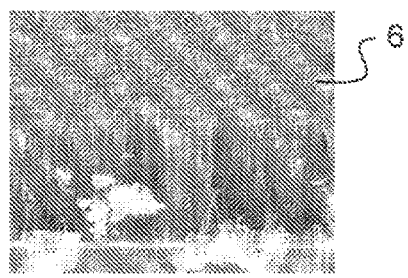
FIGS. 6A to 6C show a mat 6 of CNTs 60 in the MWNT form obtained according to example 6 of the invention with a substrate made of $SiO_2$ respectively supporting one graphene layer, two graphene layers or three graphene layers.
Figure 6B:
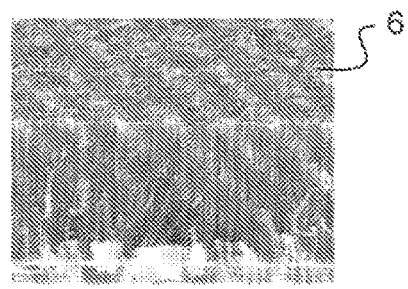
Figure 6C:
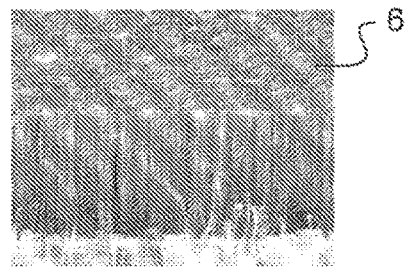
Figure 6D:
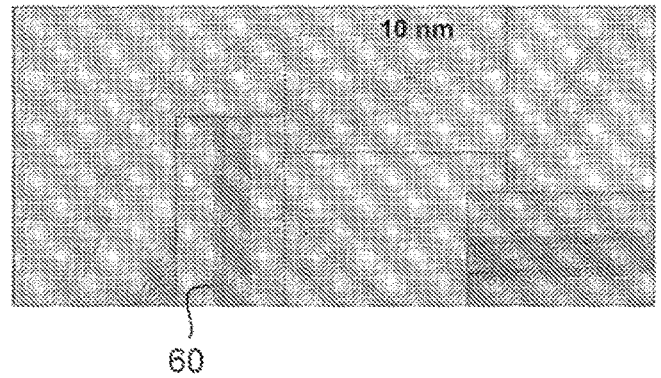
FIG. 6D shows in detail a CNT obtained according to this example 6 with a substrate made of $SiO_2$ supporting at least one graphene layer.

The invention is not limited to the examples which have just been described; it is possible in particular to combine together characteristics of the examples illustrated within nonillustrated alternative forms.

REFERENCES CITED

[1]: "Carbon Nanotubes—Synthesis, Characterization, Applications", edited by Dr. Siva Yellampalli, Jul. 20, 2011;

[2]: Sookhyun Hwang et al., "*Effect of a Titanium Underlayer on the Ohmic Contact of Single-Walled Carbon Nanotubes*", Chinese Journal of Physics, 49, 1102 (2011);

[3]: Yu Zhu et al., "*A seamless three-dimensional carbon nanotube graphene hybrid material*", Nature Communications, 3, 1225 (2012);

[4]: Lance Delzeit et al., "*Multiwalled Carbon Nanotubes by Chemical Vapor Deposition Using Multilayered Metal Catalysts*", J. Phys. Chem. B, 2002, 106, 5629-5635.

The invention claimed is:

1. A substrate which is electrically conducting on at least one of its faces, provided with a stack of thin layers comprising at least one layer of catalyst material appropriate for accelerating the growth of carbon nanotubes, wherein the stack comprises the sequence of thin layers deposited in the following order above said at least one electrically conducting face of the substrate:
    a/ metal layer made of metal M or layer made of metal alloy based on the metal M or layer made of graphene;
    b/ titanium (Ti) layer;
    c/ aluminum (Al) layer;
    d/ layer of material(s) which are catalysts of the growth of carbon nanotubes.

2. The substrate as claimed in claim 1, being a bulk metal substrate.

3. The bulk metal substrate as claimed in claim 2, the metal of the substrate being chosen from copper (Cu), aluminum (Al), stainless steel, nickel (Ni) or platinum (Pt).

4. The substrate as claimed in claim 1, being a substrate coated with one or more thin electrically conducting layers forming said electrically conducting face.

5. The substrate as claimed in claim 4, the thin electrically conducting layers) being chosen from titanium nitride (TiN), tantalum nitride (TaN) or graphene.

6. The substrate as claimed in claim 4, being an electrically insulating substrate, such as a substrate made of silicon (Si) or made of silicon dioxide ($SiO_2$).

7. The substrate as claimed in claim 1, the metal M of the metal layer deposited directly on the electrically conducting face of the substrate being chosen from iron (Fe), chromium (Cr), nickel (Ni), cobalt (Co) or palladium (Pd), and also from all the binary, ternary or quaternary alloys between these metals.

8. The substrate as claimed in claim 1, the material(s) which is(are) catalyst(s) of the growth of the carbon nanotubes (CNTs) of the layer of the top of the stack being chosen from iron (Fe), chromium (Cr), nickel (Ni), cobalt (Co) or palladium (Pd), and also from all the binary, ternary or quaternary alloys between these metals.

9. The substrate as claimed in claim 1, the layer deposited directly on the electrically conducting face of the substrate and the layer of material which is a catalyst of the growth of carbon nanotubes being composed of the same material.

10. The substrate as claimed in claim 1, the thickness of the layer deposited directly on the electrically conducting face of the substrate being between 1 and 20 nm.

11. The substrate as claimed in claim 1, the thickness of the Ti layer being between 2 and 10 nm.

12. The substrate as claimed in claim 1, the thickness of the Al layer being between 2 and 10 nm.

13. The substrate as claimed in claim 1, the thickness of the layer of materials which are catalysts of the growth of carbon nanotubes being between 0.2 and 5 nm.

14. The substrate as claimed in claim 1, the stack being as follows: bulk substrate made of copper or of aluminum/Fe/Ti/Al/Fe, the iron (Fe) layer directly in contact with the bulk substrate having a thickness of between 1 and 10 am.

15. The substrate as claimed in claim 1, the stack being as follows: bulk substrate made of stainless steel/Ti/Al/Fe.

16. The substrate as claimed in claim 1, the stack being as follows: substrate made of titanium nitride (TiN) or tantalum nitride (TaN) in the form of thin layers/Fe/Ti/Al/Fe, the iron (Fe) layer directly in contact with the substrate having a thickness of between 10 and 20 nm.

17. The substrate as claimed in claim 1, the stack being as follows: bulk substrate covered with one or more layers made of graphene/Fe/Ti/Al/Fe, the iron (Fe) layer directly in contact with the graphene having a thickness of between 1 and 10 nm.

18. A functional substrate comprising a substrate as claimed in claim 1 coated with a mat of carbon nanotubes (CNTs).

19. The functional substrate as claimed in claim 18, the CNTs density being greater than $10^{12}/cm^2$, indeed even $10^{13}/cm^2$.

20. A process for the preparation of a functional substrate as claimed in claim 18, according to which the following stages are carried out:
    preparation, by vacuum evaporation, of the stack of thin layers with the metal layer made of metal M or layer made of metal alloy based on the metal M or layer made of graphene (2), on the electrically conducting face of the substrate as claimed in claim 1;
    growth of mat of carbon nanotubes (CNTs) on the stack according to a chemical vapor deposition (CVD) technique, enhanced or not enhanced by plasma and activated or nonactivated by hot wires (Hot Wire CVD or HWCVD).

21. The process as claimed in claim 20, according to which, before carrying out the growth stage, the layer of catalyst materials is oxidized by means of an air plasma.

22. A substrate which is electrically conducting on at least one of its faces, provided with a stack of thin layers comprising at least one layer of catalyst material appropriate for accelerating the growth of carbon nanotubes, wherein the stack comprises the sequence of thin layers deposited in the following order above said at least one electrically conducting face of the substrate:
    b/ titanium (Ti) layer;
    c/ aluminum (Al) layer;
    d/ layer of materials which are catalysts of the growth of carbon nanotubes.

* * * * *